(12) United States Patent
Chen et al.

(10) Patent No.: US 8,575,671 B2
(45) Date of Patent: *Nov. 5, 2013

(54) ASYMMETRIC MIM CAPACITOR FOR DRAM DEVICES

(71) Applicants: Intermolecular, Inc., San Jose, CA (US); Elpida Memory, Inc., Tokyo (JP)

(72) Inventors: Hanhong Chen, Milpitas, CA (US); Hiroyuki Ode, Higashihiroshima (JP)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/692,460

(22) Filed: Dec. 3, 2012

(65) Prior Publication Data
US 2013/0093051 A1   Apr. 18, 2013

Related U.S. Application Data

(63) Continuation of application No. 13/195,528, filed on Aug. 1, 2011, now Pat. No. 8,349,696.

(51) Int. Cl.
*H01L 27/108* (2006.01)
*H01L 29/94* (2006.01)

(52) U.S. Cl.
USPC ..... 257/306; 257/303; 257/310; 257/E29.343

(58) Field of Classification Search
USPC .......................... 257/303, 306, 310, E29.343
See application file for complete search history.

(56) References Cited

U.S. PATENT DOCUMENTS

| 5,383,088 A * | 1/1995 | Chapple-Sokol et al. ..... 361/305 |
| 6,475,854 B2 * | 11/2002 | Narwankar et al. ........... 438/238 |
| 8,349,696 B1 * | 1/2013 | Chen et al. .................... 438/393 |

OTHER PUBLICATIONS

Kim et al., "Ruthenium Oxide Thin Fim Electrodes for Supercapacitors", Electrochem. Solid—State Lett., vol. 4 (5), A62-A64 (2001).*

* cited by examiner

*Primary Examiner* — Asok K Sarkar

(57) ABSTRACT

A bilayer second electrode for a MIM DRAM capacitor is formed wherein the layer of the electrode that is in contact with the dielectric layer (i.e. bottom layer) has a composition that is resistant to oxidation during subsequent anneal steps and have rutile templating capability. Examples include $SnO_2$ and $RuO_2$. The capacitor stack including the bottom layer is subjected to a PMA treatment to reduce the oxygen vacancies in the dielectric layer and reduce the interface states at the dielectric/second electrode interface. The other component of the bilayer (i.e. top layer) is a high work function, high conductivity metal or conductive metal compound.

20 Claims, 4 Drawing Sheets

ASYMMETRIC MIM CAPACITOR FOR DRAM DEVICES

CROSS-REFERENCE TO RELATED APPLICATIONS

This is a Continuation Application of U.S. patent application Ser. No. 13/195,528 filed on Aug. 1, 2011, which is herein incorporated by reference for all purposes.

This document relates to the subject matter of a joint research agreement between Intermolecular, Inc. and Elpida Memory, Inc.

FIELD OF THE INVENTION

The present invention relates generally to the use of non-noble metal electrodes in capacitors used in Dynamic Random Access Memory (DRAM) devices.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

One class of high-k dielectric materials possessing the characteristics required for implementation in advanced DRAM capacitors are high-k metal oxide materials. Titanium dioxide (TiO$_2$) is a metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of TiO$_2$, the anatase crystalline phase of TiO$_2$ has a dielectric constant of approximately 40, while the rutile crystalline phase of TiO$_2$ can have a dielectric constant of approximately >80. Due to the higher-k value of the rutile-phase, it is desirable to produce TiO$_2$ based DRAM capacitors with the TiO$_2$ in the rutile-phase. The relative amounts of the anatase phase and the rutile phase can be determined from x-ray diffraction (XRD). From Eqn. 1 above, a TiO$_2$ layer in the rutile-phase could be physically thicker and maintain the desired capacitance. The increased physical thickness is important for lowering the leakage current of the capacitor. The anatase phase will transition to the rutile phase at high temperatures (>800 C). However, high temperature processes are undesirable in the manufacture of DRAM devices.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which MoO$_2$ and MoO$_3$ are two examples. These two oxides of molybdenum have different properties. MoO$_2$ has shown great promise as an electrode material in DRAM capacitors. MoO$_2$ has a distorted rutile crystal structure and serves as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) degrade the performance of the $MoO_2$ electrode because they do not promote the deposition of the rutile-phase of $TiO_2$ and have higher resistivity than $MoO_2$. For example, $MoO_3$ (the most oxygen-rich phase) has an orthorhombic crystal structure and is a dielectric.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in a reducing atmosphere have been developed that allow crystalline $MoO_2$ to be used as the first electrode (i.e. bottom electrode) in MIM DRAM capacitors with $TiO_2$ or doped-$TiO_2$ high-k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference. However, these MIM DRAM capacitors have continued to use noble metal (i.e. Ru) materials for the second electrode (i.e. top electrode).

The use of crystalline $MoO_2$ as a second electrode in MIM DRAM capacitors has been difficult due to a number of problems. After the formation of the second electrode, the capacitor stack is then subjected to a post metallization anneal (PMA) treatment. The PMA treatment serves to crystallize the second electrode and to anneal defects in the dielectric and interface states that are formed at the dielectric/second electrode interface during the deposition. Also, if there is no post dielectric anneal (PDA) treatment done before metallization, the PMA treatment can serve to crystallize the dielectric layer to improve the k value and fill oxygen vacancies. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference. As discussed above, $MoO_2$ is sensitive to oxidation to form oxygen-rich compounds that negatively impacts its performance as an electrode material. The reducing atmosphere anneal processes discussed previously with respect to the use of crystalline $MoO_2$ as a first electrode are not an option at this stage of the device manufacture because they would degrade the performance of the dielectric layer through the formation of oxygen vacancies. $TiO_2$ high k dielectric materials are especially sensitive to processing conditions and increases in the leakage current are observed, likely due to the formation of oxygen vacancies.

The continued use of noble metals (such as Ru) as the second electrode produces an asymmetric capacitor stack. In one example, the asymmetric stack consists of a $MoO_2$ first electrode, a dielectric layer, and a Ru second electrode. The asymmetric stack provides a number of problems. First, Ru is expensive and increases the cost of manufacturing for the DRAM device. Second, the leakage current of the MIM DRAM device increases at high temperatures (i.e. 90 C) to above the desired target of $<10^{-7}$ A $cm^{-2}$ at 1V. Third, if a PMA treatment in a dilute oxidizing atmosphere is required after the formation of the second electrode, the control of the Ru second electrode layer is difficult. Ru will react with an oxidizing species to form volatile $RuO_4$. Additionally, the formation of $RuO_2$ induces an unacceptably high surface roughness.

Therefore, there is a need to develop processes that allow the formation of a second electrode material for MIM DRAM devices that lowers the cost and is compatible with PMA treatments that use an oxidizing atmosphere. Furthermore, there is a need to develop processes that allow the formation of a second electrode material for MIM DRAM devices that lowers the leakage current at high temperatures (i.e. 90 C).

SUMMARY OF THE INVENTION

In some embodiments of the present invention, a thin layer of $SnO_2$ or $RuO_2$ is formed on top of the dielectric material. The capacitor stack may then be subjected to a PMA treatment in an oxidizing atmosphere to fill the oxygen vacancies in the dielectric material and reduce the interface states at the dielectric/second electrode interface. A thicker, high conductivity layer may then be formed on top of the thin layer to complete the formation of the second electrode. An additional PMA treatment is not required after the formation of the thick layer. The thin layer of $SnO_2$ or $RuO_2$ may be doped to further increase the layer's conductivity.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
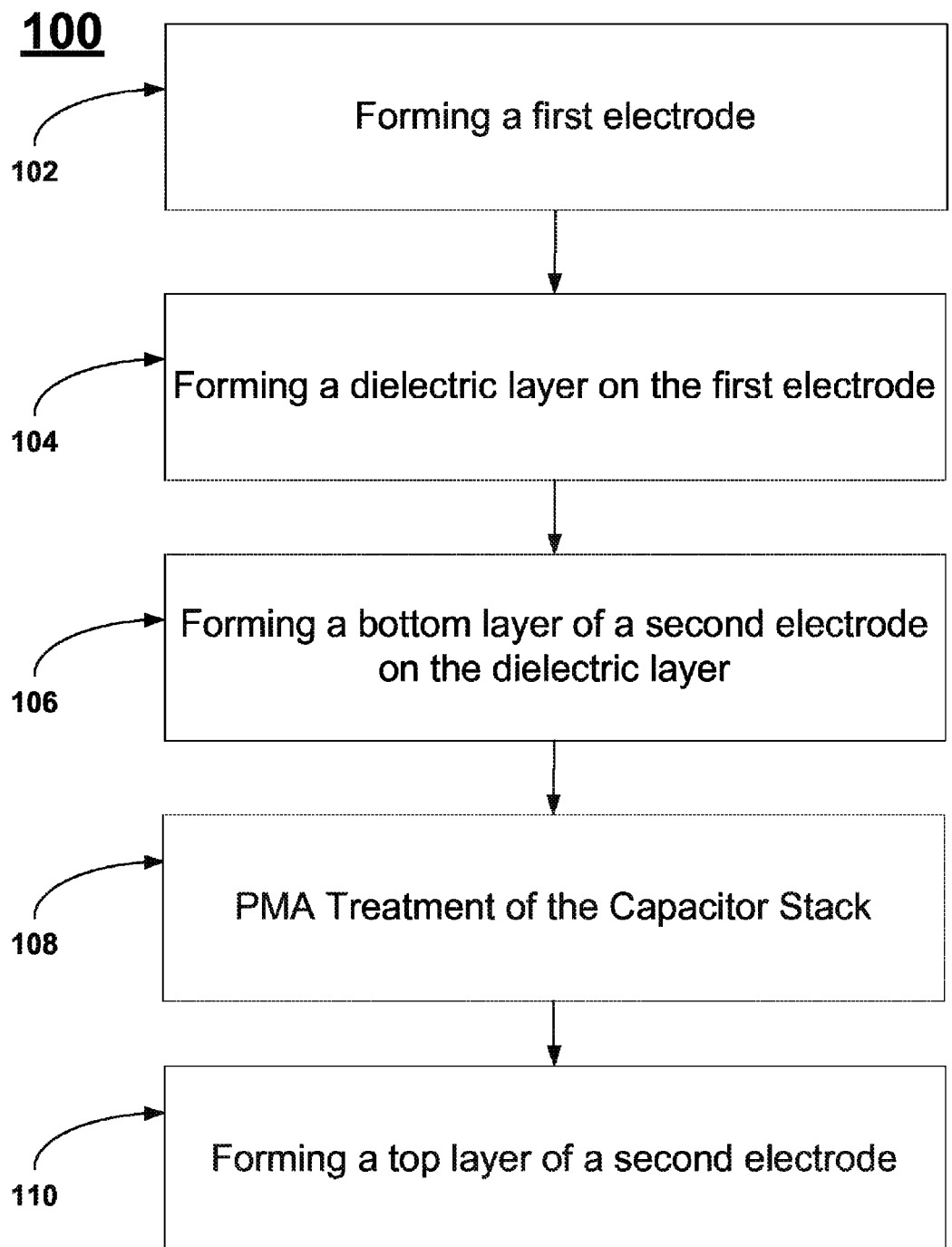
FIG. 1 illustrates a flow chart illustrating a method for fabricating a DRAM capacitor stack in accordance with some embodiments of the present invention.

FIG. 1 describes a method, 100, for fabricating a DRAM capacitor stack. The initial step, 102, comprises forming a first electrode layer on a substrate. Examples of suitable electrode materials comprise metals, conductive metal oxides, conductive metal silicides, conductive metal nitrides, and combinations thereof. A particularly interesting class of materials is the conductive metal oxides. Optionally, the first electrode layer can then be subjected to an annealing process (not shown). The next step, 104, comprises forming a dielectric material on the first electrode layer. Optionally, the dielectric layer can then be subjected to an annealing process (not shown). The next step, 106, comprises forming a bottom layer of a bilayer second electrode structure on the dielectric layer. The bottom layer is a thin layer of a conductive metal oxide that is resistive to further oxidation during subsequent anneal steps. The next step, 108, subjects the capacitor stack to a PMA treatment. The PMA treatment may use an inert atmosphere or an atmosphere comprising an oxidizing atmosphere. The next step, 110, comprises forming a top layer of a bilayer second electrode structure on the bottom layer of a bilayer second electrode structure. The top layer is a high conductivity, high work function metal or conductive binary metal compound.

Those skilled in the art will appreciate that each of the first electrode layer, the dielectric layer, and the bilayer second electrode structure (both bottom and top portions) used in the MIM DRAM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

Figure 2:
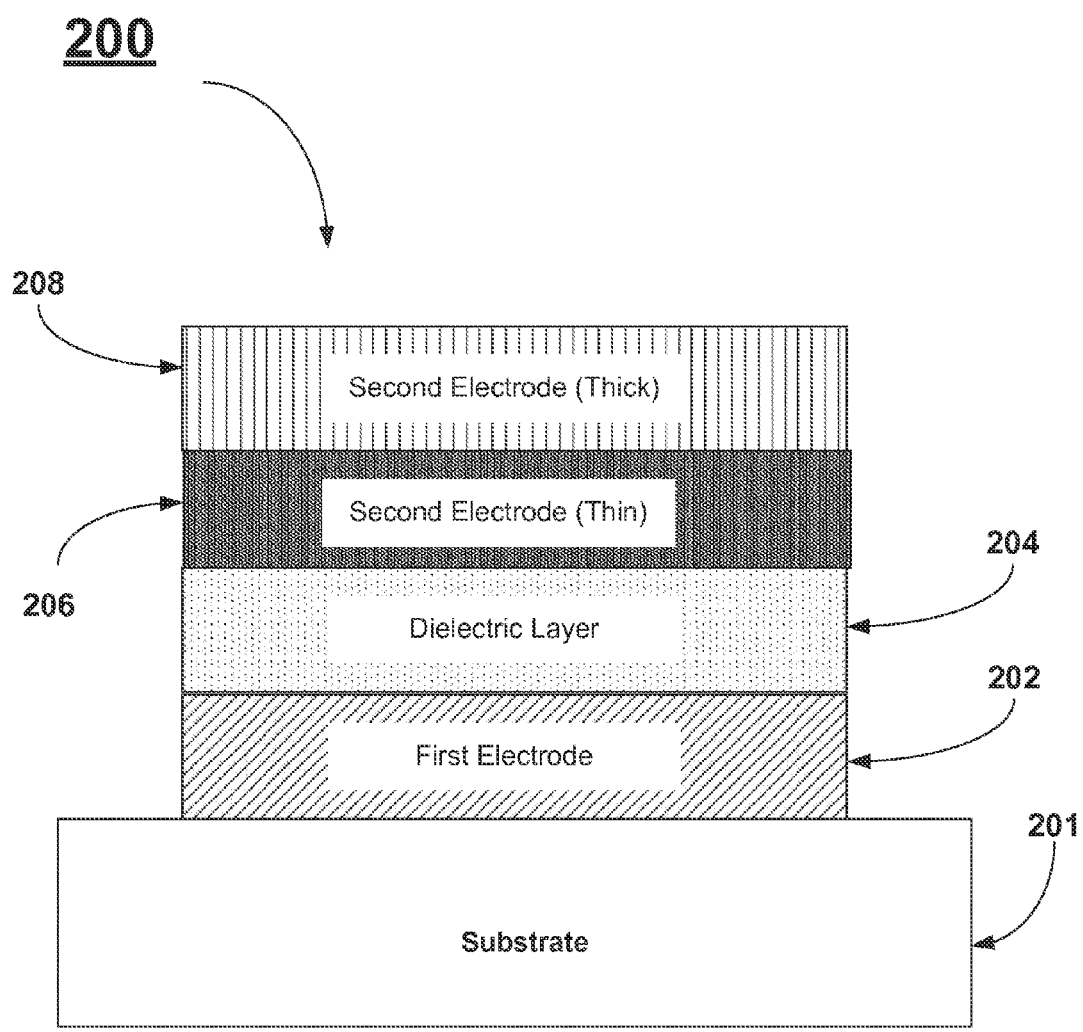
FIG. 2 illustrates a simplified cross-sectional view of a DRAM capacitor stack fabricated in accordance with some embodiments of the present invention.
Figure 3:
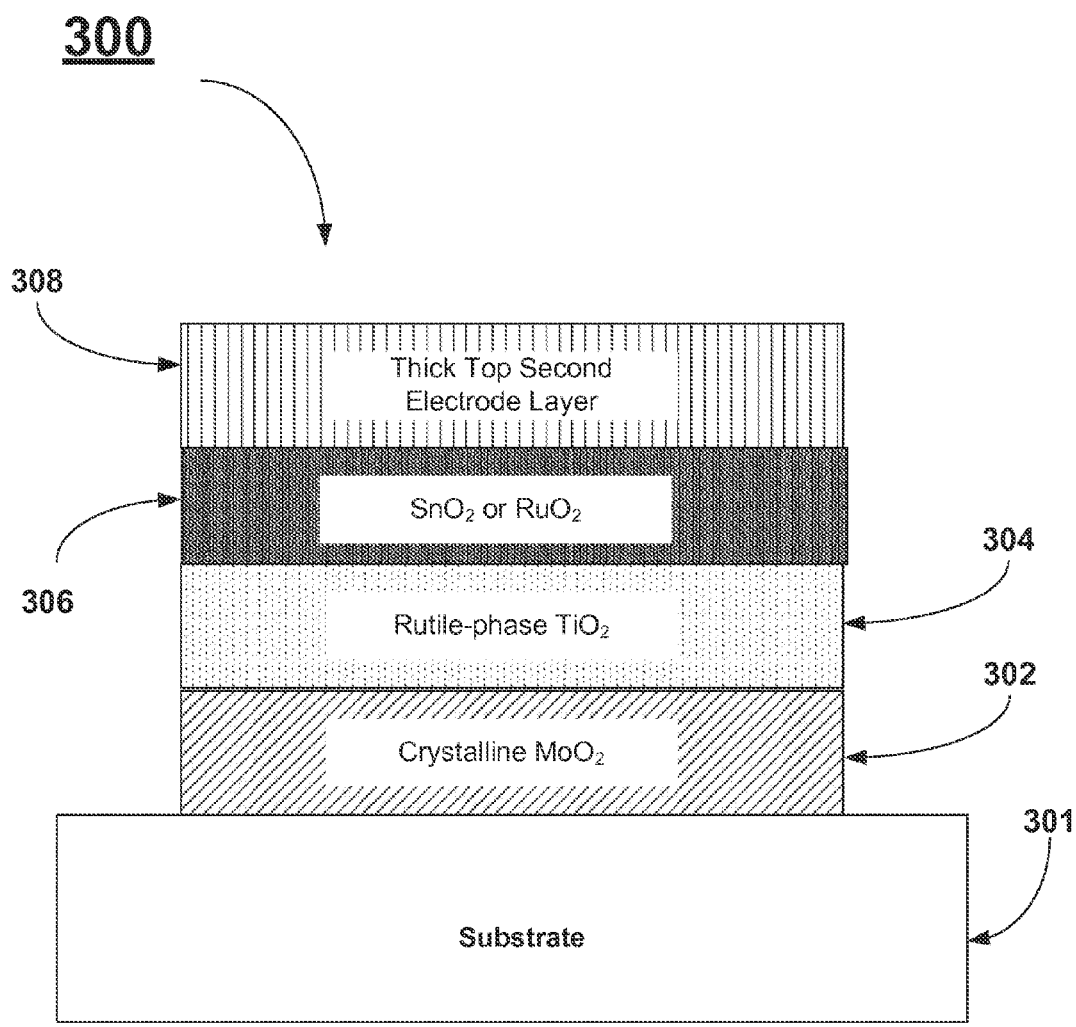
FIG. 3 illustrates a simplified cross-sectional view of a DRAM capacitor stack fabricated in accordance with some embodiments of the present invention.
Figure 4:
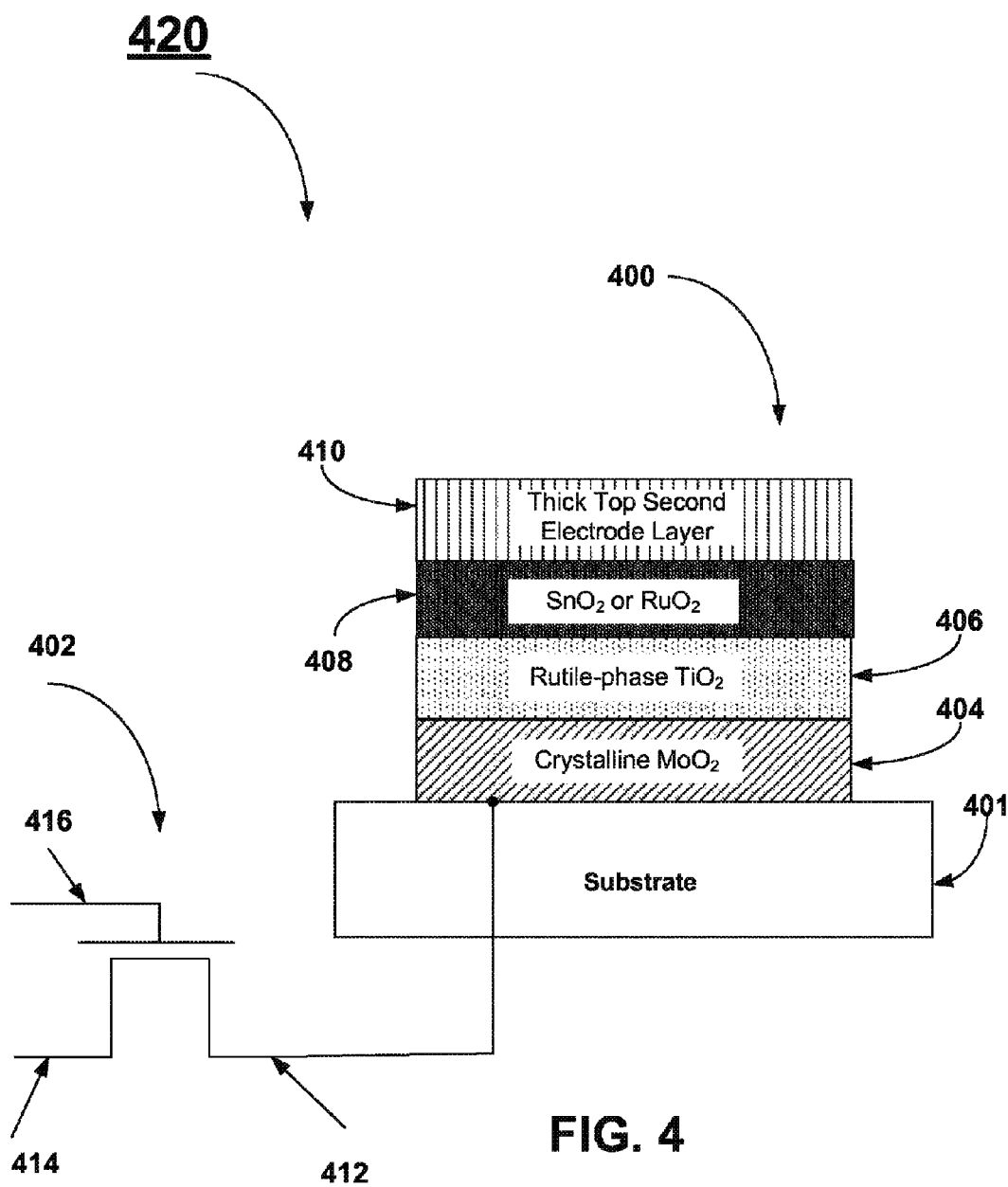
FIG. 4 illustrates a simplified cross-sectional view of a DRAM memory cell fabricated in accordance with some embodiments of the present invention.

In FIGS. 2, 3, and 4 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

FIG. 2 illustrates a simple capacitor stack, 200, consistent with some embodiments of the present invention. Using the method as outlined in FIG. 1 and described above, first electrode layer, 202, is formed on substrate, 201. Generally, the substrate has already received several processing steps in the manufacture of a full DRAM device. First electrode layer, 202, comprises one of metals, conductive metal oxides, conductive metal nitrides, conductive metal silicides, etc. Optionally, first electrode, 202, can be annealed to crystallize the material.

In the next step, dielectric layer, 204, would then be formed on the annealed first electrode layer, 202. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT), or doped versions of the same. These dielectric materials may be formed as a single layer or may be formed as a hybrid or nanolaminate structure. Typically, dielectric layer, 204, is subjected to a PDA treatment before the formation of the second electrode as mentioned earlier.

In the next step, the bottom layer of the bilayer second electrode structure, 206, is formed on dielectric layer, 204. The bottom layer of the bilayer second electrode structure may be a thin conductive binary metal compound material that is resistive to further oxidation during subsequent anneal steps. In this example, the bottom layer of the bilayer second electrode structure is a conductive metal oxide.

Typically, the capacitor stack would then be subjected to a PMA treatment. The PMA treatment serves to crystallize the bottom layer of the bilayer second electrode layer and remove interface states that may have formed at the dielectric/electrode interface during the formation process. Advantageously, the PMA treatment is performed in an atmosphere that contains an amount of an oxidizing species. The oxidizing species serves to repair oxygen vacancies that may have formed in the dielectric layer. The presence of oxygen vacancies tends to increase the leakage current in the capacitor. The bottom layer of the bilayer second electrode layer is chosen such that it does not degrade during the PMA treatment.

In the next step, the top layer of the bilayer second electrode structure, 208, is formed on the bottom layer of the bilayer second electrode structure, 206. The top layer of the bilayer second electrode structure may be a conductive binary metal compound material as described above, a metal, or a combination thereof. Advantageously, the top layer of the bilayer second electrode structure has a high work function and high conductivity. Typically, the capacitor stack, 200, would not need an additional PMA treatment.

FIG. 3 illustrates a simple capacitor stack, 300, consistent with some embodiments of the present invention. Using the method as outlined in FIG. 1 and described above, first electrode layer, 302, is formed on substrate, 301. Generally, the substrate has already received several processing steps in the manufacture of a full DRAM device. First electrode layer, 302, comprises one of metals, conductive metal oxides, conductive metal nitrides, conductive metal silicides, etc. For this example, first electrode layer, 302, comprises a conductive metal oxide that may serve to promote the rutile phase of $TiO_2$. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. A specific electrode material of interest is the crystalline $MoO_2$ compound of molybdenum dioxide.

Optionally, first electrode, 302, can be annealed to crystallize the material. In the case of crystalline $MoO_2$, it is advantageous to anneal the first electrode in a reducing atmosphere to prevent the formation of oxygen-rich compounds as discussed earlier.

In one example of the present invention, a first electrode comprising between about 5 nm and about 10 nm of molybdenum oxide is formed on a substrate. The molybdenum oxide electrode material is formed at a process temperature between about 125 C and 400 C using an ALD process technology. Optionally, the substrate with the first electrode is then annealed in a reducing atmosphere comprising between about 1% and about 20% $H_2$ in $N_2$ and advantageously between about 5% and about 10% $H_2$ in $N_2$ between 400 and 520 C for between about 1 millisecond and about 60 minutes.

In the next step, dielectric layer, 304, would then be formed on the annealed first electrode layer, 302. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT), or doped versions of the same. These dielectric materials may be formed as a single layer or may be formed as a hybrid or nanolaminate structure. Typically, dielectric layer, 304, is subjected to a PDA treatment before the formation of the second electrode as discussed previously. A specific dielectric material of interest is $TiO_2$ doped with $Al_2O_3$ to between about 5 atomic % and about 15 atomic % Al.

In a specific example, the dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with Al at a concentration between about 5 atomic % and about 15 atomic % Al. The $TiO_2$ dielectric layer is formed at a process temperature between about 200 C and 350 C using an ALD process technology. The substrate with the first electrode and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes.

In the next step, the bottom layer of the bilayer second electrode structure, 306, is formed on dielectric layer, 304. The bottom layer of the bilayer second electrode structure may be a conductive binary metal compound material as described above. In this example, the bottom layer of the bilayer second electrode structure is a conductive metal oxide, and more specifically, $SnO_2$ or $RuO_2$. $SnO_2$ is resistant to further oxidation if annealed in an atmosphere containing an oxidizing species. Similarly, $RuO_2$ is somewhat stable if annealed in an atmosphere containing an oxidizing species. However, some of the $RuO_2$ will oxidize to form volatile $RuO_4$ which will be lost during the anneal step. The $SnO_2$ layer may be doped to further increase its conductivity. Examples of suitable dopants comprise Sb and F with doping concentrations between about 0 and about 20 atomic %.

In one example of the present invention, the bottom layer of the bilayer second electrode structure comprising between about 0.5 nm and about 5.0 nm of $SnO_2$ or $RuO_2$ is formed on a substrate. Both $SnO_2$ and $RuO_2$ have tetragonal crystal structures and their lattice constants are similar to rutile $TiO_2$. Second electrode layers that have crystal structures that are not compatible with the rutile phase of $TiO_2$ tend to form a low k interfacial layer at the dielectric/electrode interface. This has a negative impact on the capacitor stack performance and results in a higher EOT. For example, a $MoO_2$/9 nm Al:$TiO_2$/$RuO_2$ stack will have an EOT of about 0.5 nm. Additionally, they can improve the k value of $TiO_2$. A $MoO_2$/9 nm Al:$TiO_2$/Pt stack will have an EOT of about 0.7 nm because the Pt crystal structure is not compatible with the rutile phase $TiO_2$. Advantageously, the thickness of the bottom layer of the bilayer second electrode structure is about 0.5 nm to about 5.0 nm. The bottom layer of the bilayer second electrode structure is formed at a process temperature between about 125 C and 400 C using an ALD process technology. This layer is then annealed before the top layer of the bilayer second electrode structure is formed.

In the next step, the top layer of the bilayer second electrode structure, 308, is formed on the bottom layer of the bilayer second electrode structure, 306. The top layer of the bilayer second electrode structure may be a conductive binary metal compound material as described above, a metal, or a combination thereof. Advantageously, the top layer of the bilayer second electrode structure has a high work function and high conductivity. Typically, the capacitor stack would not need an additional PMA treatment. Examples of suitable materials for the top layer of the bilayer second electrode structure comprise Pt, Ir, Pd, Ni, Co, NiN, WN, VN, or combinations thereof. The thickness of the top layer of the bilayer second electrode structure will be between about 5.0 nm and about 10.0 nm.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 4 is used to illustrate one DRAM cell, 420, manufactured using a bilayer second electrode structure as discussed previously. The cell, 420, is illustrated schematically to include two principle components, a cell capacitor, 400, and a cell transistor, 402. The cell transistor is usually constituted by a MOS transistor having a gate, 416, source, 412, and drain, 414. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 3, the cell capacitor, 400, comprises a first electrode, 404, formed on substrate, 401. The first electrode, 404, is connected to the source or drain of the cell transistor, 402. For illustrative purposes, the first electrode has been connected to the source, 412, in this example. For the purposes of illustration, first electrode, 404, will be crystalline $MoO_2$ in this example. As discussed previously, first electrode, 404, may be subjected to an anneal in a reducing atmosphere before the formation of the dielectric layer to crystallize the $MoO_2$ and to reduce any $MoO_{2+x}$ compounds that may have formed during the formation of the first electrode. Dielectric layer, 406, is formed on top of the first electrode. For the purposes of illustration, dielectric layer, 406, will be rutile-phase $TiO_2$. As discussed previously, the $TiO_2$ may be doped. Typically, the dielectric layer is then subjected to a PDA treatment. The bottom layer of the bilayer second electrode structure, 408, is then formed on top of the dielectric layer. For the purposes of illustration, the bottom layer of the bilayer second electrode structure, 408, will be $SnO_2$ in this example. The capacitor stack is then subjected to a PMA treatment. The top layer of the bilayer second electrode structure, 410, is then formed on top of the bottom layer of the bilayer second electrode structure. For the purposes of illustration, the top layer of the bilayer second electrode structure, 410, will be a high work function, high conductivity metal or conductive metal compound. This completes the formation of the capacitor stack.

Although the foregoing examples have been described in some detail for purposes of clarity of understanding, the invention is not limited to the details provided. There are many alternative ways of implementing the invention. The disclosed examples are illustrative and not restrictive.

What is claimed:
1. A semiconductor layer stack comprising:
a first electrode layer;
a dielectric layer on the first electrode layer, wherein the dielectric layer has a rutile crystal structure; and a bilayer second electrode structure on the dielectric layer,
wherein the bilayer second electrode structure comprises a bottom layer on the dielectric layer and a top layer on the bottom layer, and
wherein the bottom layer has a tetragonal crystal structure,
the tetragonal crystal structure being compatible with the rutile crystal structure of the dielectric layer such that a low k interfacial layer is not formed at an interface formed by the bottom layer and the dielectric layer.

2. The semiconductor layer stack of claim 1 wherein the bottom layer of the bilayer second electrode structure comprises a conductive metal oxide.

3. The semiconductor layer stack of claim 2, wherein the conductive metal oxide comprises one of tin oxide, or ruthenium oxide.

4. The semiconductor layer stack of claim 3 wherein the conductive metal oxide comprises tin oxide.

5. The semiconductor layer stack of claim 1 wherein the conductive metal oxide further comprises a dopant.

6. The semiconductor layer stack of claim 5 wherein the dopant is Sb or F with doping concentrations between about 0 and about 20 atomic %.

7. The semiconductor layer stack of claim 3 wherein the conductive metal oxide comprises ruthenium oxide.

8. The semiconductor layer stack of claim 1 wherein the top layer of the bilayer second electrode structure comprises one of Pt, Ir, Pd, Ni, Co, NiN, WN, VN, or combinations thereof.

9. The semiconductor layer stack of claim 1 wherein the bottom layer of the bilayer second electrode is thinner than the top layer of the bilayer second electrode.

10. The semiconductor layer stack of claim 3 wherein the thickness of the bottom layer of the bilayer second electrode is between about 0.5 nm and about 5.0 nm.

11. The semiconductor layer stack of claim 8 wherein the thickness of the top layer of the bilayer second electrode is between about 5.0 nm and about 10.0 nm.

12. The semiconductor layer stack of claim 1 wherein the bottom layer is crystallized by using a PMA treatment that uses an atmosphere comprising an oxidizing atmosphere.

13. A semiconductor layer stack comprising:
a dielectric layer,
wherein the dielectric layer has a rutile crystal structure; and
a bottom layer formed on the dielectric layer,
wherein the bottom layer comprises a conductive metal oxide; and
a top layer formed on the bottom layer;
wherein the bottom layer has a tetragonal crystal structure,
the tetragonal crystal structure being compatible with the rutile crystal structure of the dielectric layer such that a low k interfacial layer is not formed at an interface formed by the bottom layer and the dielectric layer.

14. The semiconductor layer stack of claim 13, wherein the conductive metal oxide forming the bottom layer comprises one of tin oxide or ruthenium oxide.

15. The semiconductor layer stack of claim 14 wherein the conductive metal oxide comprises tin oxide.

16. The semiconductor layer stack of claim 13 wherein the conductive metal oxide further comprises a dopant.

17. The semiconductor layer stack of claim 16 wherein the dopant is Sb or F.

18. The semiconductor layer stack of claim 13 wherein the conductive metal oxide comprises ruthenium oxide.

19. The semiconductor layer stack of claim 13 wherein the top layer comprises one of Pt, Ir, Pd, Ni, Co, NiN, WN, VN, or combinations thereof.

20. The semiconductor layer stack of claim 13 wherein the bottom layer is thinner than the top layer.

* * * * *